(12) United States Patent
Buck et al.

(10) Patent No.: US 6,396,582 B1
(45) Date of Patent: May 28, 2002

(54) WAVELENGTH REFERENCE FOR LASER

(75) Inventors: Jesse D. Buck, San Marcos; Raymond F. Cybulski, San Diego; Peter C. Newman, Encinitas; Palash P. Das, Vista, all of CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/206,526

(22) Filed: Dec. 7, 1998

Related U.S. Application Data

(63) Continuation-in-part of application No. 08/896,384, filed on Jul. 18, 1997, now Pat. No. 5,978,391.

(51) Int. Cl.⁷ .................................................. G01J 3/28
(52) U.S. Cl. ........................ 356/328; 356/437; 356/326; 372/20; 372/57; 372/102; 372/29
(58) Field of Search .............................. 372/20, 57, 32, 372/102, 29; 356/328, 326, 437

(56) References Cited

U.S. PATENT DOCUMENTS

| | | | |
|---|---|---|---|
| 3,600,091 A | * 8/1971 | Gobel et al. .................. | 356/85 |
| 4,488,311 A | * 12/1984 | Davis et al. .................. | 372/89 |
| 4,575,243 A | * 3/1986 | Witte ......................... | 356/333 |
| 4,823,354 A | 4/1989 | Znotins et al. | |
| 4,983,039 A | * 1/1991 | Harada et al. .............. | 356/328 |
| 4,991,178 A | * 2/1991 | Wani et al. .................... | 372/32 |
| 5,015,099 A | 5/1991 | Nagai et al. | |
| 5,018,855 A | * 5/1991 | Davison et al. ............. | 356/312 |
| 5,025,445 A | 6/1991 | Anderson et al. | |
| 5,450,207 A | 9/1995 | Fomenkov | |
| 5,780,843 A | 7/1998 | Cliche et al. | |
| 5,835,520 A | 11/1998 | Das et al. | |
| 5,978,394 A | * 11/1999 | Newman et al. ............... | 372/32 |
| 6,028,879 A | * 2/2000 | Ershov ........................ | 372/57 |

OTHER PUBLICATIONS

Joseph A. Judith A. Bowman, J. V. Sullivan and A. Walsh, (Title: "Isolation of atomic resonance lines by selective modulation", by Atomic absorption spectroscopy digest, Feb. 1966, pp. 205–210).*

Born et al., Principles of Optics Electromagnetic Theory of Propagation, Interference and Diffraction of Light, 6th ed. (New York: Pergamon Press, 1975), xxvi.

Henderson, "Chap 20—Optical instruments," Bass, ed., Handbook of optics/sponsored by the Optical Society of America, 2nd ed. (USA: McGraw–Hill, 1995), II, 20.1–20.5.

Sears, Principles of Physics Series: Optics, 3rd ed. (USA, Addison–Wesley Publishing Co, Inc., 1958) 160–167.

* cited by examiner

Primary Examiner—Paul Ip
Assistant Examiner—Delma R. Flores Ruiz
(74) Attorney, Agent, or Firm—John R. Ross

(57) ABSTRACT

The present invention includes a system and method for characterizing the wavelength of a beam of radiation using a known reference transition. The invention comprises a vapor including a material having a transition which absorbs radiation of a known wavelength, the vapor being contained in a container. The container includes an optical path along which the beam of radiation can propagate through the vapor. A dispersive optical element is aligned along the optical path. A detector is aligned along the optical path after the dispersive element. Wavelength information about the beam of radiation is determined from the position of a dip in the detector signal that is correlated to the known reference transition. This method is most useful when the laser bandwidth substantially exceeds the transition bandwidth.

47 Claims, 4 Drawing Sheets

WAVELENGTH REFERENCE FOR LASER

CONTINUING APPLICATION DATA

The present application is a continuation-in-part of United States Patent Application Ser. No. 08/896,384, filed Jul. 18, 1997. Now U.S. Pat. No. 5,978,391, issue date Nov. 2, 1999.

FIELD OF THE INVENTION

The present invention relates to systems and methods for measuring the wavelength and wavelength shifts of electromagnetic radiation, and more specifically to systems and methods for characterizing the wavelength and wavelength shift of a beam of laser radiation.

DESCRIPTION OF RELATED ART

Lasers such as excimer lasers are employed in a wide range of applications and uses. During many of these applications or uses the output wavelength of the laser must be actively controlled and measured during the operation cycle of the laser. For example, when lasers are used in the fabrication of integrated circuits, the wavelength output by the laser must be well characterized.

Conventional fabrication techniques for integrated circuits use a laser beam to selectively expose an optically sensitive material. Portions of the material not exposed by the laser beam are subsequently etched away. Additional fabrication steps are employed to achieve a circuit matching the shape of the exposed material. The short wavelength of an excimer laser operating in the deep ultraviolet region provides the potential for very sharp edge definition. However, when exposing the optically sensitive material using the laser beam from the excimer laser, the wavelength of the laser beam must be precisely controlled or characterized to ensure that it matches the wavelength for which the optics of the system were designed. A variation in the wavelength of the laser beam can cause the beam to be defocused at the surface of the optically sensitive layer, thereby losing the advantage of the short wavelength and resulting in an imprecise rendering of the integrated circuit. This can adversely affect the electrical characteristics of the resulting integrated circuit, resulting in a poor quality or inoperable circuit.

Accordingly, precise regulation or monitoring of the output wavelength of the excimer laser is important in the fabrication of integrated circuits using excimer lasers. The output of some excimer lasers which are line narrowed can be characterized using an atomic wavelength reference approach described in U.S. Pat. No. 5,450,207, issued Sep. 12, 1995. However, this approach does not work as well for lasers having bandwidths substantially greater than that of the wavelength reference. Therefore what is needed is a system and method to characterize the wavelength of a beam of radiation which has a bandwidth too large to be characterized by traditional means.

SUMMARY OF THE INVENTION

The present invention comprises a system and a method useful for characterizing the wavelength and shifts in the wavelength of a tunable excimer laser suitable particularly for partially-line-narrowed systems having bandwidths on the order of 20 to 100 picometers. According to one embodiment of the present invention a beam of radiation output from a laser is sent through a hollow cathode lamp containing a vapor of an absorbing material such as an atom, a molecule, or an ion. The absorbing material has one or more transitions which absorb radiation within the output spectrum of the laser. The transitions in the material in the vapor are fixed in wavelength. Materials can be chosen having transitions at very well known wavelengths which can easily be found in reference books.

After the beam of radiation emerges from the hollow cathode lamp it is then sent into a spectrometer which has a detector array placed at its output. The path taken by the beam of radiation to the detector array defines an optical path for the beam of radiation through the system. The absorption of a portion of the wavelength spectrum of the beam of radiation in the vapor provides a fixed wavelength reference point, referred to as an absorption feature, from which the wavelength or changes in the wavelength of the beam of radiation output by the laser can be measured.

At the output of the spectrometer the wavelength spectrum of the laser beam will be spread out along a dimension of the detector. The wavelength position of the absorption in the vapor is set by physical properties of the transition and will remain fixed even if the wavelength spectrum of the output of the laser shifts. Therefore, as the laser output spectrum varies, the absorption feature due to the transition in the vapor will provide a fixed reference point against which to characterize movements in the laser's output spectrum.

For a typical partially-line-narrowed excimer laser, the width of the spectrum of the laser will be significantly larger than the width of the transition in the vapor when the two widths are measured by any standard parameter such as full width of the half maximum. The bandwidth of the laser should not be so large as to make the detector impractical.

If two or more absorption transitions at known wavelengths are present in the vapor within the spectrum of the laser output, then an absolute measurement of the wavelength of the laser and the shift in the laser's output wavelength spectrum is possible. Two absorption transitions with a known separation in wavelength provide a wavelength versus distance calibration for the detector. This calibration can be used to measure the amount by which the output wavelength spectrum of the laser shifts. The two absorption transitions can be from different atomic, molecular or ionic materials in the vapor or in two different vapor chambers, or from spectral shifts in a transition such as an isotope shift. It is noted that the calibration of wavelength versus distance at the detector can also be determined from the physical layout of the system. If this calibration is known then only one absorption line is required to determine the amount by which the output wavelength spectrum of the laser shifts. Another embodiment of the present invention includes a system and method for characterizing the wavelength of a beam of radiation using a known reference transition. The invention comprises a container, a vapor including a material having a transition which absorbs radiation of a known wavelength, the vapor being contained in the container. The container includes an optical path along which the beam of radiation can propagate through the vapor. A dispersive optical element is aligned along the optical path. A detector is aligned along the optical path after the dispersive element.

In still another embodiment of the invention the detector generates an output signal and the output signal includes an absorption feature. The wavelength of the beam of radiation is characterized by comparing the output signal to the absorption feature. In one embodiment of the invention, the output signal includes a first signal corresponding to the spectrum of the beam of radiation absent the absorption feature. The output signal also includes a second signal which corresponds to the spectrum of the beam of radiation after it has passed through the vapor including the material. The second signal contains the absorption feature. The beam of radiation is then characterized by comparing the first signal to the second signal.

In yet another aspect of the invention, the container includes a hollow cathode lamp and the material in a cathode in the hollow cathode lamp includes iron. In another embodiment, the material in the hollow cathode includes platinum. In still another aspect of the invention the beam of radiation has a bandwidth larger than a bandwidth of the transition. The beam of radiation may have a bandwidth for example more than twenty or more than a hundred times larger than a bandwidth of the transition.

In another embodiment of the invention the dispersive element comprises a diffraction grating. In yet another embodiment of the invention, the dispersive element comprises one or more prisms. In still another aspect of the invention, a slit is placed along the optical path so that the beam of radiation encounters the slit before the beam of radiation encounters the dispersive element. In yet another embodiment of the invention, the detector is a photodiode array.

Another embodiment of the invention includes a collimating device placed along the optical path between the dispersive element and the detector. In one aspect of this embodiment, the collimating device includes a lens.

Another embodiment of the invention comprises a laser generating the beam of radiation. In still another aspect of the invention, the laser comprises an excimer laser, and in yet another aspect of the invention the excimer laser comprises a gain medium containing Krypton Fluoride. In another aspect, the excimer laser comprises a gain medium containing Argon Fluoride.

DETAILED DESCRIPTION

Figure 1:
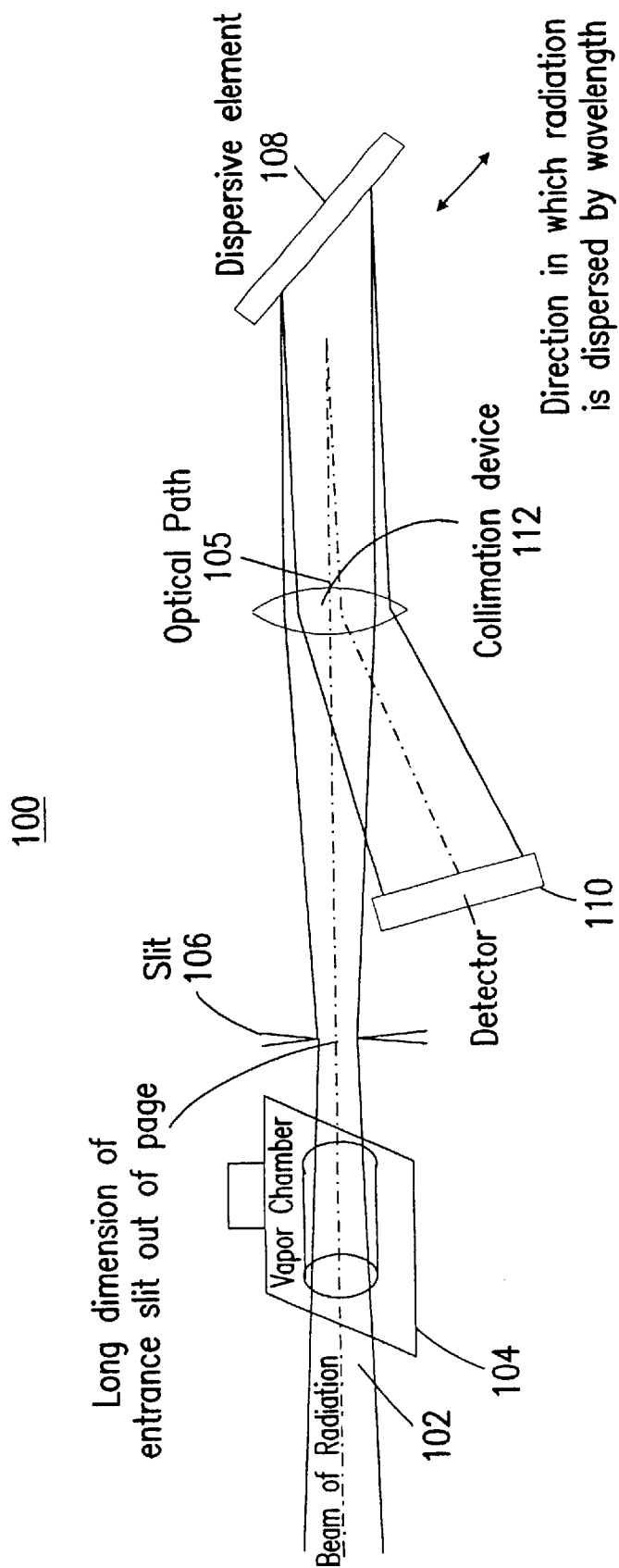
FIG. 1 is a schematic drawing showing one embodiment of the present invention in which a beam of radiation is sent though an absorbing vapor. The radiation is diffracted by a grating and impinges on a detector.

FIG. 1 depicts one embodiment of the present invention, system 100. In this embodiment of the invention, beam 102 of radiation having a bandwidth of for example 20 to 100 picometers, enters vapor chamber 104. Beam 102 of radiation can be any type of electromagnetic radiation from any type of source, including but not limited to a laser, an excimer laser, a Krypton Fluoride excimer laser, an Argon Fluoride excimer laser, a non-linear generation device, or a discharge lamp. Vapor chamber 104 can be any type of chamber containing an absorbing vapor medium. Vapor chamber 104 may be but is not limited to a hollow cathode lamp, a heat pipe, or any other open or enclosed container. In some cases it may be useful that the absorbing vapor is an atomic or molecular beam in a vacuum chamber, to reduce doppler broadening and thus obtain a narrower width of the absorbing feature. The vapor chamber 104 may be placed in system 100 at any point along optical path 105. For example, vapor chamber 104 could be placed in beam of radiation 102 after slit 106 or after dispersive element 108.

After beam 102 of radiation exits vapor chamber 104 it impinges on slit 106. Beam 102 of radiation is depicted as being focussed into slit 106, however the beam 102 of radiation may be passed through slit 106 without being focussed, or slit 106 may be removed from system 100 in various embodiments.

After beam 102 of radiation passes through slit 106 it passes through collimation device 112 and hits dispersive element 108. Collimation device 112 is optional, and can be put in beam 102 of radiation at any point along its path if desired due to design consideration. Collimation device 112 can be a lens, a system of lenses, a mirror, a system of mirrors, and may include refractive or reflective properties of dispersive element 108. For example, dispersive element 108 may be a curved grating which in combination with collimation device 112 acts to collimate beam 102 of radiation. In other embodiments of the invention, optical path 105 passes through collimation device 112 only once.

Figure 2:
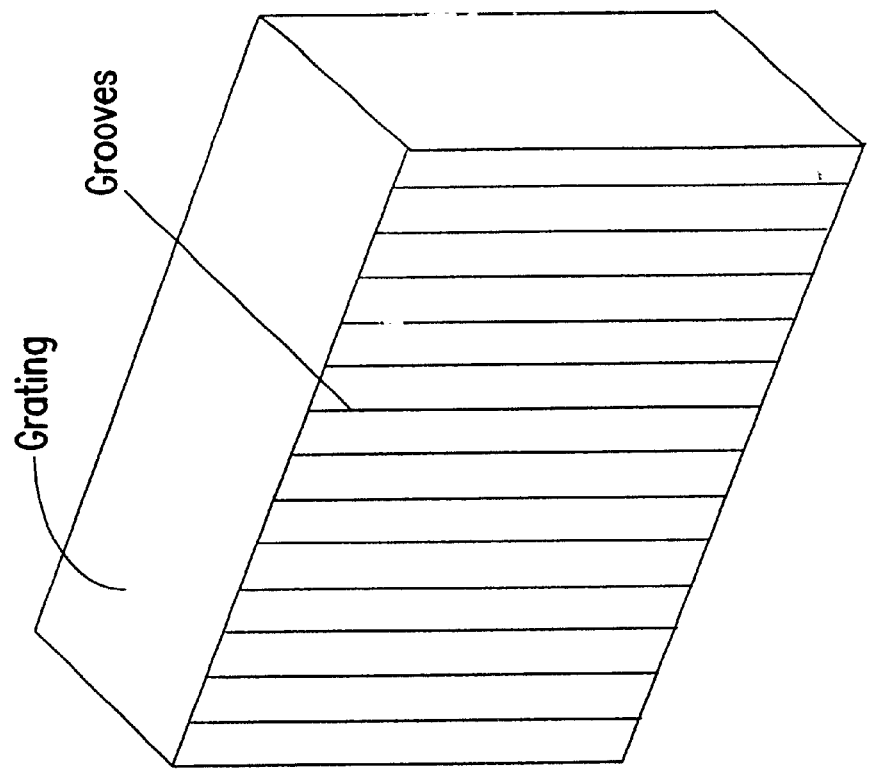
FIG. 2 is a schematic drawing showing the relative orientation of a slit and a grating in one embodiment of the invention.
Figure 2:
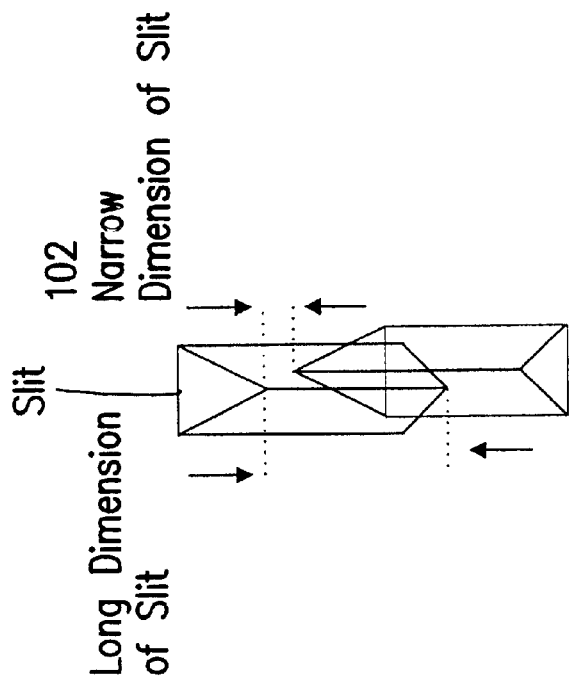

Dispersive element 108 can be a grating, one or more prisms, a system including gratings and prisms, or any other system which disperses radiation by wavelength. If slit 106 is present in system 100 it should be oriented so that the longer dimension of slit 106 is substantially perpendicular to the direction in which the radiation is dispersed by wavelength by dispersive element 108. This relationship is depicted in FIG. 2 for slit 106 and grating 202. The longer dimension of slit 106 is shown substantially parallel to the grooves on grating 202, and therefore substantially perpendicular to the direction in which the radiation is dispersed by wavelength by grating 202.

Figure 3A:
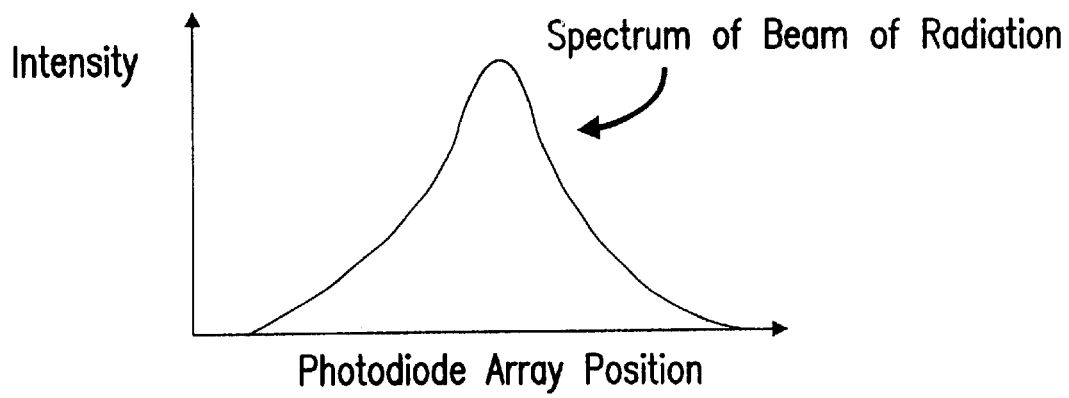
FIG. 3A is a graph depicting output of a detector showing the spectrum of a beam of radiation before absorption of a portion of the beam of radiation by a transition in the vapor cell.
Figure 3B:
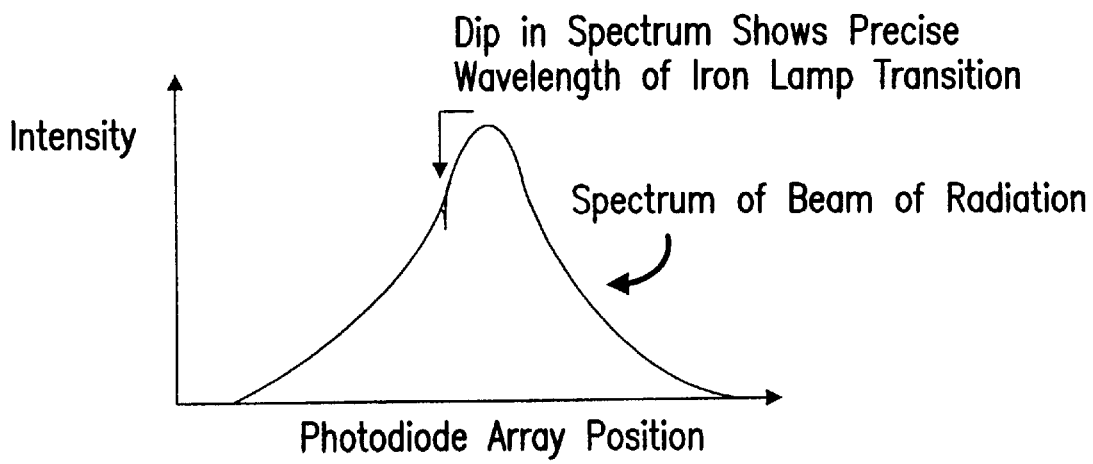
FIG. 3B is a graph depicting output of a detector showing the spectrum of a beam of radiation and an absorption dip due to absorption of a portion of the beam of radiation by a transition in the vapor cell before the wavelength of the beam of radiation has been shifted.
Figure 3C:
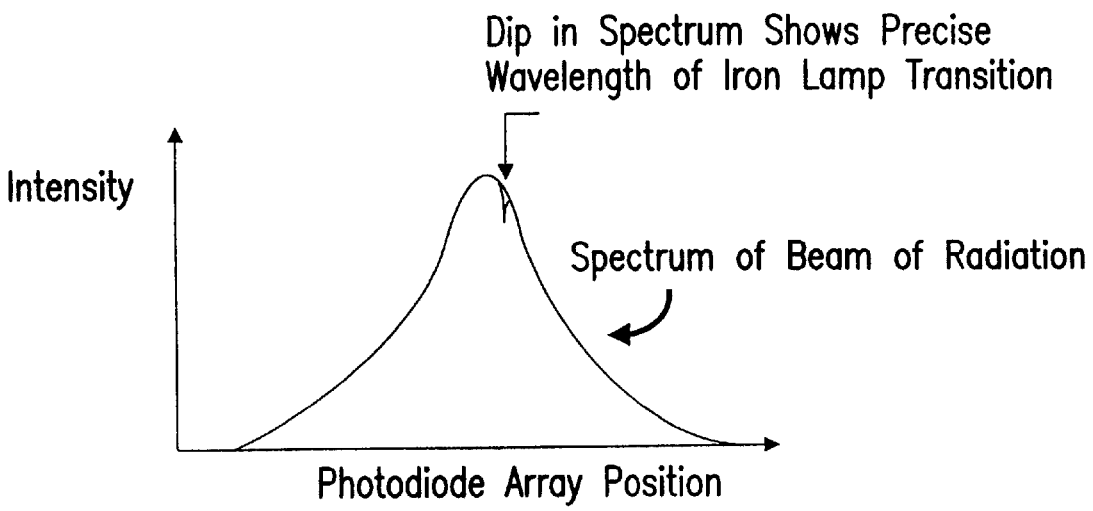
FIG. 3C is a graph depicting output of a detector showing the spectrum of a beam of radiation and an absorption dip due to absorption of a portion of the beam of radiation by a transition in the vapor cell after the wavelength of the beam of radiation has been shifted.

In FIG. 1, the beam of radiation is dispersed in a transverse pattern according to wavelength by dispersive element 108, passes through collimation device 112, and then is detected by detector 110. Detector 110 detects the dispersed beam of radiation 102 according to the pattern. Detector 110 can be any type of system or device which is sensitive to radiation in beam of radiation 106, including but not limited to a photodiode array, a CCD array, or film. Examples of the output of detector 110 are depicted in FIGS. 3A–3C. FIG. 3A shows the output from detector 110 for a typical spectrum for a partially-line-narrowed excimer laser before a portion has been absorbed in the vapor. When the wavelength of the laser is tuned or shifts for any reason it is difficult to reliably determine which direction or by how much the wavelength of the laser has shifted since there is no fixed reference point if a wavelength reference system is not employed.

The absorption transition in the vapor provides a fixed wavelength reference with a bandwidth of for example 0.8 to 1.2 picometers, against which shifts in the wavelength of the laser's broader output spectrum (e.g. 20 to 100 picometers) can be measured. FIGS. 3B and 3C show examples of the output of detector 110 when a portion of the laser output has been absorbed in the vapor. In FIG. 3B the absorption feature representing absorption of part of beam of radiation 102 by the absorbing material in vapor chamber 106 appears as a dip in the spectrum. When the wavelength of the laser shifts, the spectrum detected by the detector shifts in wavelength while the feature due to the transition remains fixed at the wavelength of the transition. FIG. 3C depicts the output of detector 110 after the laser's output spectrum has shifted. The fixed absorption feature appears in a different portion of the spectrum and the shift in wavelength of the laser's output spectrum becomes apparent.

Figure 4:
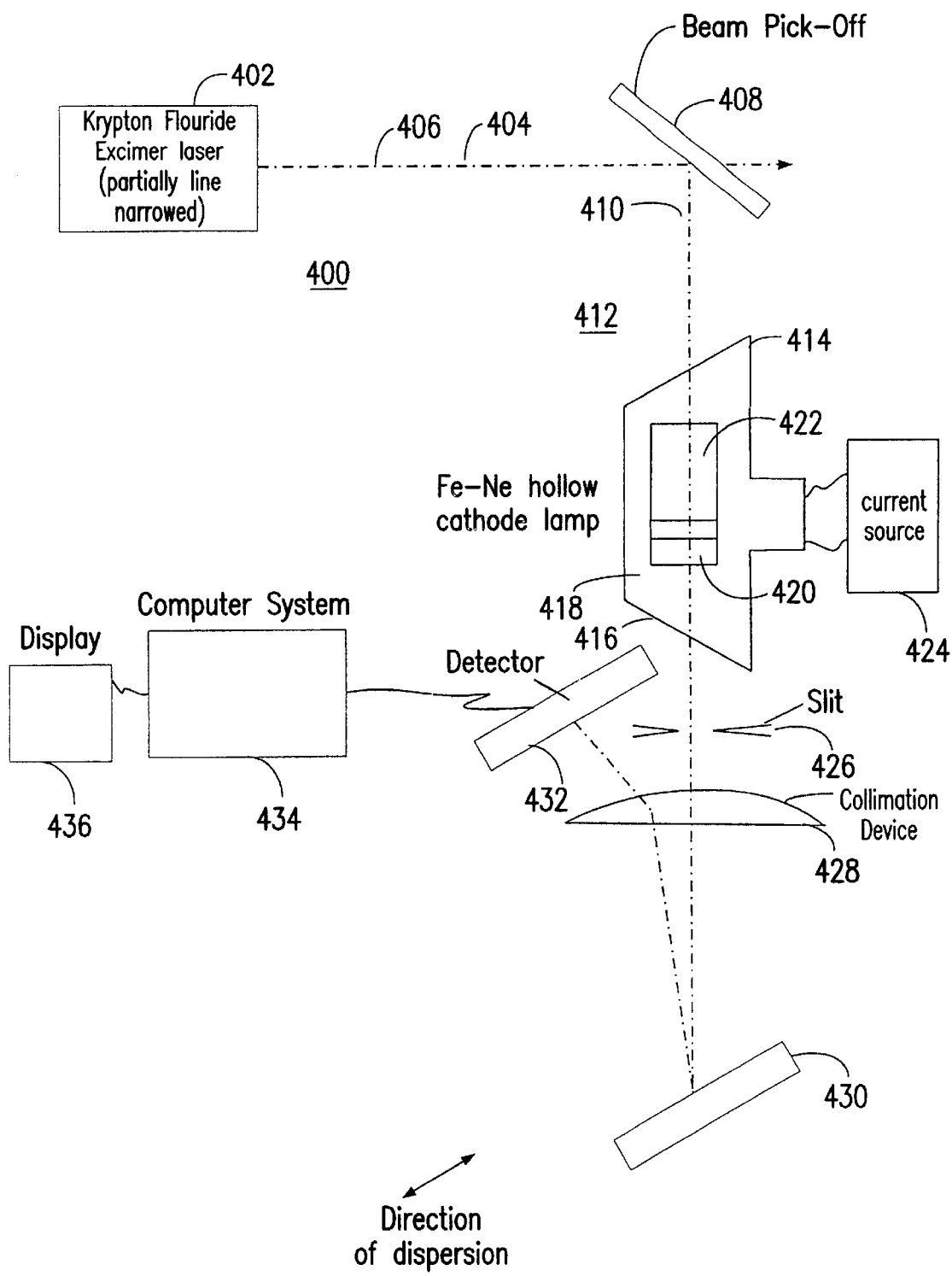
FIG. 4 depicts an embodiment of the invention in which a computer system receives and processes an output signal from the detector.

FIG. 4 depicts yet another embodiment of the invention, system 400. In this embodiment, Krypton Fluoride excimer laser 402 generates output beam of radiation 404 along optical path 406. Beam pick-off 408 reflects a small portion of output beam 404 of radiation, beam 410 of radiation and directs it into hollow cathode lamp 412. Beam pick-off 408 may be any device or optical system which will direct a portion of laser beam 406 into hollow cathode lamp 412, including but not limited to a partially reflecting mirror, or an uncoated optical element. In other embodiments of the invention, the portion of output beam of radiation 404 idrected to hollow cathode lamp 412 is the portion transmitted through beam pick-off 408. In these embodiments beam pick-off 408 may reflect less of output beam 404 of radiation than it transmits.

Hollow cathode lamp 412 includes a transparent (over the bandwidth of interest) entrance window 414 and a transparent exit window 416 each tilted at an angle to avoid unwanted reflection, for example 10 degrees, from the path of beam 410 of radiation. Entrance window 414 and exit window 416 form portions of a sealed chamber 418 having anode 420 and cathode 422 mounted therein. Cathode 422 is a generally tubular or annular cathode aligned with beam of radiation 410 such that beam 410 is transmitted through an interior aperture of cathode 422. Anode 420 and cathode 422 are electrically connected to current control mechanism 424 which allows a selected amount of electrical current to be conducted through anode 420 and cathode 422. In one embodiment of the invention, cathode 420 is fabricated from iron and chamber 418 is filled with a neon filler gas. In another embodiment, cathode 420 is platinum and chamber 418 is filled with neon.

In use, a pre-selected amount of current is conducted through anode 420 and cathode 422 causing vaporization of a portion of the material forming cathode 422. The vaporous material fills the interior of cathode 422 through which beam 410 of radiation is transmitted. The vaporous material absorbs a portion of beam 410 of radiation at a wavelength determined by characteristics of the cathode material. For the embodiment of the invention wherein the cathode is fabricated from iron, a wavelength of maximum absorption occurs at a wavelength equal to 248.3271 nm with a FWHM width of about ±0.3 picometers, with little or no absorption occurring at wavelengths remote relative to the laser bandwidth from the wavelength of maximum absorption. Other absorption wavelengths exist, such as at about 248.4187 for iron, and can also be used. For a platinum cathode, maximum absorption occurs at 193.4369 nm.

Beam 410 of radiation, after possible partial absorption within chamber 418, exits hollow cathode lamp 412 through exit window 416 and then passes through slit 426. Beam 410 of radiation then goes through collimation device 428 and impinges on dispersion device 430. In one embodiment of the invention, dispersion device 430 is a grating. Suitable gratings include ruled gratings and holographic gratings.

When beam 410 of radiation is reflected from dispersion device 430, it is dispersed in wavelength. Beam 410 of radiation then passes again through collimation device 428 and then hits detector 432. In one embodiment of the invention, detector 432 is a linear array of detection devices such as an array of charge coupled devices (CCD array); however any array of detection devices sensitive to beam of radiation 432 can be used. Also, a scanning single detector could be applied.

Detector 432 is coupled to computer system 434. Computer system 432 generically represents any type of computer system, such as a microprocessor-based system, a mainframe system, or any other type of general or special purpose computing system which includes an interface, a processor, and a memory. The processor can be any type of processor such as a microprocessor, dedicated logic, a digital signal processor, a programmable gate array, a neural network, or a central processor unit implemented in any other technology.

The output of detector 432 is sent to computer system 434 and stored in memory. Computer system 434 may display the output on optional display 436. In an embodiment of the invention not shown, computer system 434 is coupled to current source 424 and controls the amount of current that current source 424 supplies to hollow cathode lamp 412. In this embodiment, computer system 434 can control the amount of vapor in hollow cathode lamp 412 that beam of radiation 410 passes through, by changing the current.

In one aspect of the invention, computer system 434 reduces the current from current source 424 until there is only very slight absorption or no absorption at all of beam of radiation 410 in hollow cathode lamp 412. Computer system 434 then stores the output from detector 432. This output may be called a baseline signal. Then computer system 434 increases the current from current source 424 until there is more absorption of beam 410 of radiation in hollow cathode lamp 412. Computer system 432 then again stores the output form detector 432. This signal may be called the absorption signal. Computer system 432 then subtracts the baseline signal from the absorption signal resulting in the absorption feature becoming more prominent. A baseline signal may be taken as often as desired, and for example may be taken more often for a laser which has higher output power fluctuations.

The foregoing description of embodiments of the present invention are presented for the purposes of illustration and description only. They are not intended to be exhaustive or to limit the invention to the forms disclosed. Many modifications and variations will be apparent to practitioners skilled in the art. It is intended that the scope of the invention be defined by the following claims and their equivalents.

What is claimed is:

1. A system for characterizing a beam of radiation having a bandwidth, comprising:
   a container;
   a vapor including a material having a transition which absorbs radiation of a known wavelength, the vapor being contained in the container, the container having an optical path along which the beam of radiation can propagate through the vapor;
   a dispersive element aligned along the optical path which spatially disperses the beam of radiation in a pattern according to wavelength across the bandwidth including the known wavelength; and a detector aligned along the optical path after the dispersive element and positioned to detect the dispersed beam of radiation according to the pattern, said pattern providing a spatial indication of the wavelength of the beam relative to the known wavelength.

2. The system of claim 1, comprising:

a collimation device, the collimation device aligned along the optical path between the container and the dispersive element and the collimation device also aligned along the optical path between the dispersive element and the detector.

3. The system of claim 2, wherein:

the collimating device includes a lens.

4. The system of claim 1, wherein the vapor comprises a material having two or more transitions within the pattern detected by the detector.

5. The system of claim 1, comprising:

an excimer laser generating the beam of radiation.

6. The system of claim 5, wherein:

the excimer laser comprises a gain medium containing Krypton Fluoride.

7. The system of claim 5, wherein:

the excimer laser comprises a gain medium containing Argon Fluoride.

8. The system of claim 1, wherein:

the detector generates an output signal and the output signal includes an absorption feature at the known wavelength; and wherein characterizing the wavelength of the beam of radiation includes comparing the output of the detector to the absorption feature in the output of the detector.

9. The system of claim 1, wherein:

the container comprises a hollow cathode lamp.

10. The system of claim 9, wherein:

the hollow cathode lamp comprises a cathode containing iron and the material includes iron.

11. The system of claim 9, wherein:

the hollow cathode lamp comprises a cathode containing platinum and the material includes platinum.

12. The system of claim 1, wherein:

the bandwidth of the beam of radiation is more than 20 times larger than a bandwidth of the transition.

13. The system of claim 1, wherein:

the bandwidth of the beam of radiation is more than 100 times larger than a bandwidth of the transition.

14. The system of claim 1, wherein:

the dispersive element comprises a diffraction grating.

15. The system of claim 1, comprising:

a slit placed along the optical path so that the beam of radiation encounters the slit before the beam of radiation encounters the dispersive element.

16. The system of claim 1, wherein:

the detector comprises a photodiode array.

17. A system for characterizing a wavelength of a beam of radiation having a bandwidth, comprising:

a hollow cathode lamp aligned along an optical path;

a material in the hollow cathode lamp having a transition which absorbs radiation of a known wavelength;

a slit aligned along the optical path after the hollow cathode lamp;

a grating aligned along the optical path after the slit; and a detector aligned along the optical path after the grating and positioned to receive radiation diffracted off of the grating according to a pattern of diffraction, said pattern of diffraction providing a spatial indication of the wavelength of the beam relative to the known wavelength.

18. The system of claim 17, wherein:

the detector generates an output signal and the output signal includes an absorption feature at the known wavelength; and wherein characterizing the wavelength of the beam of radiation includes comparing the output of the detector to the absorption feature in the output of the detector.

19. The system of claim 17, wherein:

the hollow cathode lamp comprises a cathode containing iron, and iron is the material.

20. The system of claim 17, wherein:

the hollow cathode lamp comprises a cathode containing platinum, and platinum is the material.

21. The system of claim 17, comprising:

a collimating device aligned along the optical path between the grating and the detector.

22. The system of claim 21, wherein:

the collimating device is aligned along the optical path between the hollow cathode lamp and the grating.

23. The system of claim 17, wherein the vapor comprises a material having two or more transitions within the pattern detected by the detector.

24. The system of claim 17, wherein:

the detector comprises a photodiode array.

25. The system of claim 17, comprising:

a laser, wherein the laser emits the beam of radiation and the beam of radiation propagates along the optical path.

26. The system of claim 25, wherein:

the laser comprises an excimer laser.

27. The system of claim 26, wherein:

the excimer laser comprises a gain medium containing Krypton Fluoride.

28. The system of claim 26, wherein:

the excimer laser comprises a gain medium containing Argon Fluoride.

29. The system of claim 17, wherein:

the beam of radiation has a bandwidth more than 20 times larger than a bandwidth of the transition.

30. The system of claim 17, wherein:

the beam of radiation has a bandwidth more than 100 times larger than a bandwidth of the transition.

31. A method for characterizing a wavelength of a beam of radiation having a bandwidth, comprising:

sending the beam of radiation through a vapor of a medium wherein the medium has a transition which absorbs radiation of a known wavelength;

spatially dispersing the beam of radiation by wavelength; and detecting at least a portion of the dispersed beam of radiation according to a pattern, said pattern providing a spatial indication of the wavelength of the beam relative to the known wavelength.

32. The method of claim 31, comprising:

generating the beam of radiation using a laser.

33. The method of claim 32, wherein:

the laser comprises an excimer laser.

34. The method of claim 33, wherein:

the excimer laser comprises a gain medium containing Krypton Fluoride.

35. The method of claim 33, wherein:

the excimer laser comprises a gain medium containing Argon Fluoride.

36. The method of claim 31, wherein:

detecting includes generating a detection signal; and characterizing the wavelength of the beam of radiation includes comparing the detection signal to an absorption feature in the detection signal.

37. The method of claim 31, wherein:

the beam of radiation has a bandwidth more than 20 times larger than a bandwidth of the transition.

38. The method of claim 31, wherein:

the beam of radiation has a bandwidth more than 100 times larger than a bandwidth of the transition.

39. The method of claim 31, wherein:

sending the beam of radiation through a vapor includes sending the beam of radiation through a hollow cathode lamp.

40. The method of claim 31, wherein:

the transition includes a transition in iron.

41. The method of claim 31, wherein:

the transition includes a transition in platinum.

42. The method of claim 31, wherein:

spatially dispersing the beam of radiation includes diffracting the radiation off of a grating.

43. The method of claim 31, wherein:

detecting at least a portion of the radiation includes detecting the radiation using an array of photodiodes.

44. The method of claim 31, comprising:

varying a center wavelength of the beam of radiation.

45. The method of claim 31, wherein the medium has two or more transitions.

46. A method for characterizing a beam of radiation having a bandwidth, said method comprising:

transmitting an incident beam of radiation through a vapor, said vapor including a material having a transition which absorbs radiation of a known wavelength included within the bandwidth;

creating a dispersed beam by spatially dispersing said incident beam of radiation in an intensity pattern which varies as a function of wavelength over the bandwidth; and detecting said intensity pattern of said dispersed beam, said pattern being indicative of a wavelength of said incident beam relative to said known wavelength.

47. The method of claim 46 wherein said detecting includes generating a detection signal having an absorption feature indicative of the known wavelength.

* * * * *